US007005657B1

(12) United States Patent
Low et al.

(10) Patent No.: US 7,005,657 B1
(45) Date of Patent: Feb. 28, 2006

(54) WAFER-SCANNING ION IMPLANTER HAVING FAST BEAM DEFLECTION APPARATUS FOR BEAM GLITCH RECOVERY

(75) Inventors: Russell J. Low, Rowley, MA (US); Gordon C. Angel, Salem, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 11/051,018

(22) Filed: Feb. 4, 2005

(51) Int. Cl.
*H01J 37/317* (2006.01)

(52) U.S. Cl. ................................................ 250/492.21

(58) Field of Classification Search ........... 250/492.21, 250/396 R

See application file for complete search history.

(56) References Cited

U.S. PATENT DOCUMENTS

| | | | | |
|---|---|---|---|---|
| 4,829,179 A | | 5/1989 | Aoki et al. | 250/309 |
| 4,922,106 A | | 5/1990 | Berrian et al. | 250/492.2 |
| 5,091,655 A | * | 2/1992 | Dykstra et al. | 250/492.2 |
| 5,311,028 A | | 5/1994 | Glavish | 250/492.21 |
| 5,483,077 A | | 1/1996 | Glavish | 250/492.21 |
| 5,757,018 A | | 5/1998 | Mack et al. | 250/492.21 |
| 6,160,262 A | | 12/2000 | Aoki et al. | 250/492.21 |
| 6,452,197 B1 | | 9/2002 | Ito | 250/492.21 |
| 6,515,408 B1 | | 2/2003 | England et al. | 313/359.1 |
| 6,635,880 B1 | | 10/2003 | Renau | 250/396 ML |

FOREIGN PATENT DOCUMENTS

| | | |
|---|---|---|
| GB | 2331179 A | 5/1999 |
| GB | 2344214 A | 5/2000 |
| GB | 2345574 A | 7/2000 |
| JP | 62-64035 | 3/1987 |
| JP | 2-172151 | 7/1990 |
| JP | 2-230648 | 9/1990 |
| JP | 4-149947 | 5/1992 |
| JP | 6-208843 | 7/1994 |
| JP | 8-250061 | 9/1996 |
| JP | 9-199440 | 7/1997 |
| JP | 9-219173 | 8/1997 |
| JP | 10-27565 | 1/1998 |
| JP | 10-40852 | 2/1998 |
| JP | 10-64470 | 3/1998 |
| JP | 10-83785 | 3/1998 |
| JP | 10-172501 | 6/1998 |
| JP | 11-337697 | 12/1999 |

* cited by examiner

*Primary Examiner*—Kiet T. Nguyen

(57) ABSTRACT

An analyzer module of an ion implanter includes beam deflection apparatus adjacent to a resolving opening from which a terminal ion beam portion of an ion beam emanates. In response to a beam deflection voltage of a first value of substantially zero volts in a first operating condition, the beam deflection apparatus directs a source ion beam portion of the ion beam toward the resolving opening to generate the terminal ion beam portion. When the beam deflection voltage has a high second value in a second operating condition, the beam deflection apparatus directs the species of the source ion beam portion away from the resolving opening such that the terminal ion beam portion is substantially extinguished. Beam control circuitry is operative during the second operating condition to transition the ion implanter to the first operating condition by rapidly switching the beam deflection voltage from the second value to the first value. An implantation method employs the features of the implanter to recover from glitches during implantation and thereby improve the yield of implanted wafers.

21 Claims, 6 Drawing Sheets

WAFER-SCANNING ION IMPLANTER HAVING FAST BEAM DEFLECTION APPARATUS FOR BEAM GLITCH RECOVERY

BACKGROUND

The present invention is related to the field of ion implanters used in semiconductor manufacturing.

An ion implanter generally includes a source that generates an ion beam including an ion species to be implanted along with a variety of undesirable ion species; an analyzer that employs a magnetic field to separate the trajectories of the various species and a resolving opening or slit through which the trajectory of the desired species passes; a module for adjusting the energy of the beam emanating from the resolving opening; and an end station in which the energy-adjusted beam interacts with wafers to effect the desired implantation.

Ion implanters can be classified according to the scanning technique that is employed to achieve relative motion between the beam and the wafers. In one class of implanters referred to herein as "beam scanning" implanters, one or more wafers being implanted are held stationary in the end station while the beam is scanned across each wafer's surface. The scanning can be achieved via magnetic or electrostatic interaction with the beam. In another class of implanters referred to herein as "wafer scanning" implanters, the beam remains substantially stationary and a wafer is mechanically moved across its path. In one sub-type of wafer scanning implanter, the cross section of the beam at the wafer is flat and broad, and therefore referred to as a "ribbon" beam, and the wafer is covered by the breadth of the beam as the wafer is scanned in the orthogonal direction (e.g., the beam may be flat in the horizontal plane and the wafer is scanned vertically). There are also implanters that employ a combination of beam scanning and wafer scanning. Each of the scanning techniques has its advantages and drawbacks, and each finds use in various semiconductor manufacturing operations.

Regardless of the scanning techniques they employ, ion implanters are generally susceptible to a class of operational problems in which the beam quality is suddenly degraded in the middle of an implantation operation, potentially rendering the wafer unusable. These problems are commonly referred to as "glitches" or "glitching" of the beam, and can be caused at various locations along the beam path. Ion implanters generally employ several electrodes along the beam path, which serve to either accelerate/decelerate the beam or to suppress spurious streams of electrons that are generated during operation. Generally, glitches occur across acceleration/deceleration gaps as well as suppression gaps. A glitch can be detected as a sharp change in the current from one of the power supplies for the electrodes. Because of the potential loss of an entire wafer, glitches are quite serious from a cost perspective, and thus measures are usually employed to both minimize the occurrence of such glitches and to recover from them if possible.

When a glitch is detected, it is ideally desired to immediately reduce the ion beam current to zero, thus terminating the implantation at a well-defined location on the wafer. Once the glitch condition has been removed, implantation ideally resumes at exactly the same location on the wafer, with ideally the same beam characteristics as existed when the glitch was detected. The goal is to achieve a uniform doping profile, and this can be achieved by controlling the beam current and/or the wafer scan speed (exposure time).

In implanters that employ beam scanning, it is generally possible to achieve glitch recovery that is reasonably close to this ideal. The circuitry that effects the normal scanning of the beam can be supplemented by glitch detection and recovery circuitry that (a) detects a glitch and immediately deflects the beam entirely away from the wafer, and (b) subsequently resumes implantation by rapidly moving the beam from off-wafer to the location at which implantation ended when the glitch was detected. Because of the fast beam deflection that can be achieved, the resulting implantation profile can be quite acceptable, and thus the wafer can be saved.

SUMMARY

In wafer scanning implanters, recovery from glitch conditions has usually involved controlling the beam intensity at the source in synchronization with the movement of the wafer across the path of the beam. When a glitch is detected, the beam is quickly extinguished, for example by switching off the power supply to the source, resulting in a localized transition between the implanted region and the not-yet-implanted region. However, it is generally not possible to use the same mechanism to resume implantation, i.e., to simply switch the source supply on as the wafer is brought back to the position at which implantation was stopped. It takes considerably longer to establish the plasma within the source than to extinguish it, and therefore it is not possible to re-establish a regulated beam current sufficiently quickly to achieve the desired uniform doping profile at normal wafer scanning speeds.

One technique that has been employed for glitch recovery in wafer scanning ion implanters is to scan the wafer in the opposite direction in a second pass, and to terminate the implantation at the point at which it was stopped on the first pass. Although somewhat effective, this technique has drawbacks including its reliance on extinguishing the plasma arc at the source. This technique cannot be used to recover from a second glitch that occurs during the final pass over the wafer, nor from a third glitch that occurs during a recovery scan. Additionally, the recovery technique is relatively complex and slow, and thus can reduce the processing throughput of the implanter. As a result, wafer scanning ion implanters have generally been at a disadvantage in relation to beam-scanning implanters with respect to glitch-related reductions in yield.

In accordance with the present invention, a wafer scanning ion implanter is disclosed that can achieve significantly better glitch recovery than prior wafer scanning implanters. In the disclosed implanter, the analyzer includes beam deflection apparatus operative (1) in response to a first beam deflection voltage in a first operating condition, to direct the ion beam onto a stationary beam path along which the ion beam normally travels during operation such that a terminal ion beam portion of the beam strikes the semiconductor wafer as the wafer is scanned across the beam path, effecting implantation, and (2) in response to a second beam deflection voltage in a second operating condition, to direct the ion beam away from the beam path such that the terminal ion beam portion does not strike the semiconductor wafer. Beam control circuitry is operative during the second operating condition to transition the ion implanter to the first operating condition by rapidly switching from the second beam deflection voltage to the first beam deflection voltage. This switching can be synchronized with the movement of the wafer to resume implantation quickly at a desired location on the wafer, yielding an acceptably uniform implantation profile and sparing the wafer from being scrapped when glitches occur.

The beam deflection apparatus can also be used to rapidly curtail implantation when a glitch is detected, rather than cutting off the power supply to the source.

In one embodiment, the beam deflection apparatus comprises a pair of spaced conductive plates located in front of a mass resolving slit in an analyzer stage of the implanter, and beam deflection occurs as a result of creating a high voltage between these plates. A first one of the plates may be connected to a fixed potential and a second one of the plates coupled to a switch that supplies the first and second values of the beam deflection voltage with respect to the fixed potential. In a more particular embodiment, the first value of the beam deflection voltage is equal to the fixed potential and the second value of the beam deflection voltage is a negative potential relative to the fixed potential. In such an embodiment, the positive-ion beam is "pulled" toward the second plate, which is generally preferable to a configuration in which the beam is "pushed" away from a plate because of the superior beam containment. The spaced conductive plates may be planar and substantially parallel to each other, or, in an alternative configuration, may be planar and slightly tilted from parallel so as to be more closely spaced at an end adjacent to the resolving opening. This latter configuration may have efficiency advantages.

BRIEF DESCRIPTION OF THE SEVERAL VIEWS OF THE DRAWING

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, with emphasis instead being placed upon illustrating the embodiments, principles and concepts of the invention.

DETAILED DESCRIPTION

Figure 1:
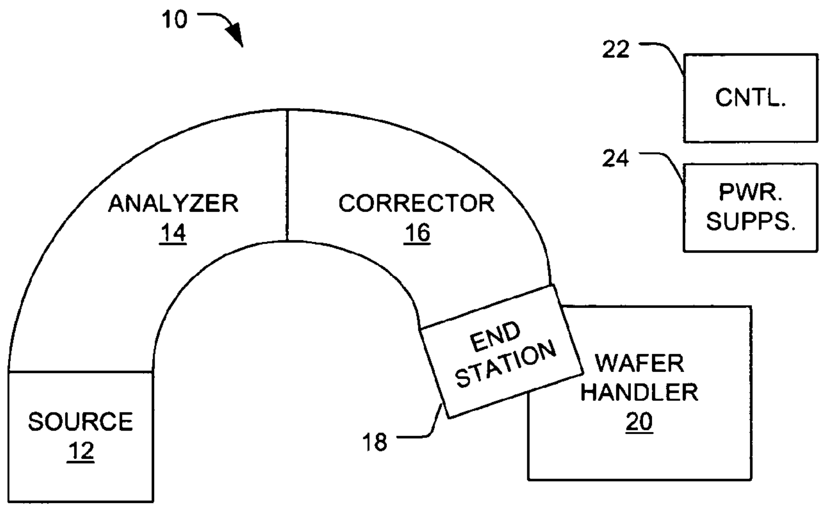
FIG. 1 is a schematic representation of an ion implanter in accordance with the present invention.

FIG. 1 shows an ion implanter 10 including a source module 12, analyzer module 14, corrector (CORR) module 16, and end station 18. Immediately adjacent to the end station 18 is a wafer handler 20. Also included are control circuitry (CNTL) 22 and power supplies (PWR SUPPS) 24, which although shown in respective blocks in FIG. 1 are actually distributed throughout the ion implanter 10 as known to those in the art.

During an implantation operation, the source module 12 is fed with a gaseous compound including the element(s) to be implanted into a semiconductor wafer. As an example, for the implantation of boron (B), gaseous boron fluoride (BF3) is supplied to the source module 12. The source module 12 employs electrical excitation to form a plasma that generally includes a number of ion species resulting from fractionation of the source compound, including the desired species (e.g., B+) that is to be implanted. As the source module 12 is biased to a relatively positive potential, the positively charged ion species are extracted from the source module 12 by acceleration out to ground potential, which is negative with respect to the positively biased source module 12. The extracted ion species form the initial part of an ion beam that enters the analyzer module 14. This initial part of the ion beam is referred to herein as the "source ion beam portion".

The analyzer module 14 includes a magnet that imparts a bend to the source ion beam portion from the source module 12. The amount of bend varies slightly for the different ion species of the beam, depending on the charge state, potential, and mass. Thus, as the beam travels toward the corrector module 16 through the analyzer module 14, it separates out due to the different trajectories of the different ion species. At the exit end, the analyzer module 14 has a resolving slit or opening (not shown in FIG. 1) through which only the species of interest (e.g., B+) passes, while the other species are collected by a conductive plate surrounding the resolving opening. Thus, at the exit of the analyzer module 14, the ion beam consists almost exclusively of the desired ion species.

As the beam of desired species enters the corrector module 16, the beam can be diverging. Thus, the role of the corrector module 16 is to condition the beam such that it is suitable for the implantation operation. For an implanter employing a ribbon beam, the corrector module 16 flattens the beam to impart the ribbon-like shape. In one embodiment, the end station 18 includes mechanical wafer scanning apparatus (not shown) that scans a wafer across the beam (which is stationary) to effect the implantation. The portion of the beam within the corrector module 16 and the end station 18 is referred to herein as the "terminal ion beam portion". The wafer handler 20 is a clean, robotic mechanical system for transferring wafers between a human operator of the system and the scanning apparatus.

Figure 2:
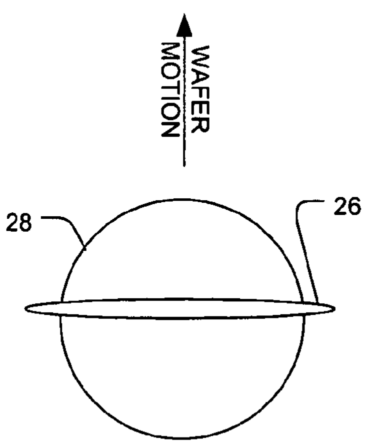
FIG. 2 is a diagram depicting the relationship between a ribbon-like ion beam and a wafer during an implantation as known in the art.

FIG. 2 illustrates implantation as viewed along the axis of a terminal ion beam portion 26 within the end station 18. It will be observed that the terminal ion beam portion has a flattened or ribbon-like cross section. As mentioned, the terminal ion beam portion 26 is stationary within the end station 18, i.e., there is no mechanism for deflecting the beam in a controlled manner as part of the implantation operation. Rather, each wafer 28 is mechanically scanned across the path of the beam 26, such as in the upward direction indicated in FIG. 2. Multiple passes are generally employed. It will be appreciated that the beam energy is selected to achieve a desired implantation depth and the beam current and wafer scan speed are selected to achieve a desired dose rate, such that the overall operation yields a uniform desired dose on the wafer 28.

Although FIG. 2 depicts a ribbon-beam style of implanter, it will be apparent to those skilled in the art that the presently disclosed methods and apparatus are likewise applicable to wafer-scanning implanters that employ static "spot" beams, i.e., beams having a generally circular cross section. Such implanters generally employ X-axis mechanical scanning of the wafer 28 in addition to the slower up-and-down scanning described above.

As mentioned above, beam transients or instabilities (referred to as "glitches") can lead to a short circuit of one of the power supplies along the beam path. If the short circuit is sufficiently severe, the power supply voltage can collapse completely, significantly altering the beam potential and resulting in the loss of beam current in the end station 18. When this occurs, the implantation is incomplete or otherwise distorted in such a way that the wafer would be ruined in the absence of remedial measures.

When a glitch occurs during the implantation of a given wafer 28, it is common to employ a remedial recovery process to somehow complete the implantation with a reasonably uniform overall profile. First, an in-progress implantation is quickly stopped when the glitch is detected. This localizes the boundary of the implanted area on the wafer 28. As mentioned above, the wafer 28 may then be scanned from the opposite direction in a second pass, for example, and the ion beam extinguished at the same location at which it was extinguished during the first pass. However, as also mentioned above, such measures may have limited effectiveness, and cannot be used when multiple glitches occur during the processing of a single wafer.

Figure 3:
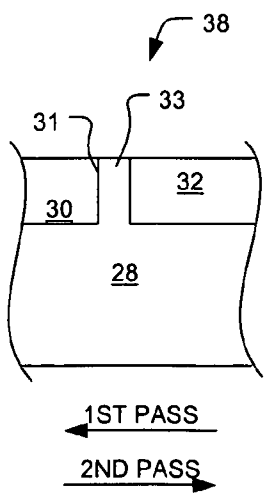
FIG. 3 is a schematic side section view of a wafer depicting implantation profiles that result when a second glitch occurs during a glitch recovery operation during implantation as known in the art.

FIG. 3 shows the result of processing in a particular multiple-glitch scenario. The wafer 28 in shown in side cross section. It is assumed that the wafer 28 is scanned from right to left, such that a first implanted region 30 is formed during the initial part of the operation, prior to the occurrence of the glitch. It will be observed that the region 30 has a fairly steep trailing-edge side wall 31. In existing ion implanters, it is generally possible to quickly extinguish the ion beam by abruptly switching off the power supply that feeds the plasma within the source module 12. The plasma arc quickly extinguishes, and thus the implantation profile quickly transitions from a target depth to zero.

During the second pass, the wafer 28 is moved left-to-right, and a second implanted region 32 is formed. Ideally, the region 32 has the same dose as the region 30, and the implantation is stopped at exactly the location of the side wall 31 of the region 30, so that the two regions 30 and 32 abut each other to form one overall region that is acceptably uniform across the entire wafer 28. However, in FIG. 3 it is assumed that a second glitch occurs before the second implantation 32 is complete, leaving a gap 33. If the gap 33 is to be filled on the last pass, it requires that the ion beam be switched on and off abruptly while the wafer 28 is scanned in its path. This is different from the first two passes, in which the beam is already established before the scanning begins. Such an operation cannot rely on quickly switching on the plasma in the source module 12, because the plasma cannot be established sufficiently quickly to achieve the steep side wall that would be required for such a third implantation. The process of striking a plasma of sufficient strength to re-establish the desired ion beam current is slow, so it is generally not possible to achieve a regulated beam current over a very short interval of the wafer 28 at normal wafer scanning speeds. In the scenario of FIG. 3, then, it has generally been the case that the wafer 28 is unusable and must be scrapped.

Figure 4:
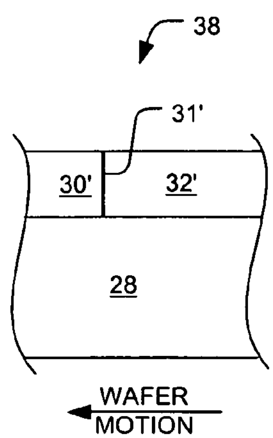
FIG. 4 is a schematic side section view of a wafer depicting an implantation profile that can be achieved during a glitch recovery operation during implantation in accordance with the present invention.

FIG. 4 illustrates how two regions 30' and 32' are abutted to form an acceptably uniform implantation across the wafer 28 using the presently disclosed techniques. It is again assumed that a glitch is detected during a first pass, such that the first region 30' is terminated at a side wall 31'. In this case, the steep transition of the side wall 31' is accomplished by switching the ion beam away from the wafer 28 (as described below) rather than extinguishing the plasma at the source module 12. During the second pass, the wafer 28 can be scanned in the same direction. The ion beam is initially off, and then quickly switched on at the location of the side wall 31 and left on to complete the implantation of the region 31'. It will be appreciated that the technique of performing a second pass by scanning from the opposite direction can alternatively be employed, again using the beam-switching described below. It will also be appreciated that the disclosed technique can be used to fill a gap (such as gap 33 of FIG. 3) that is created when multiple glitches occur during the processing of a single wafer 28.

Figure 5:
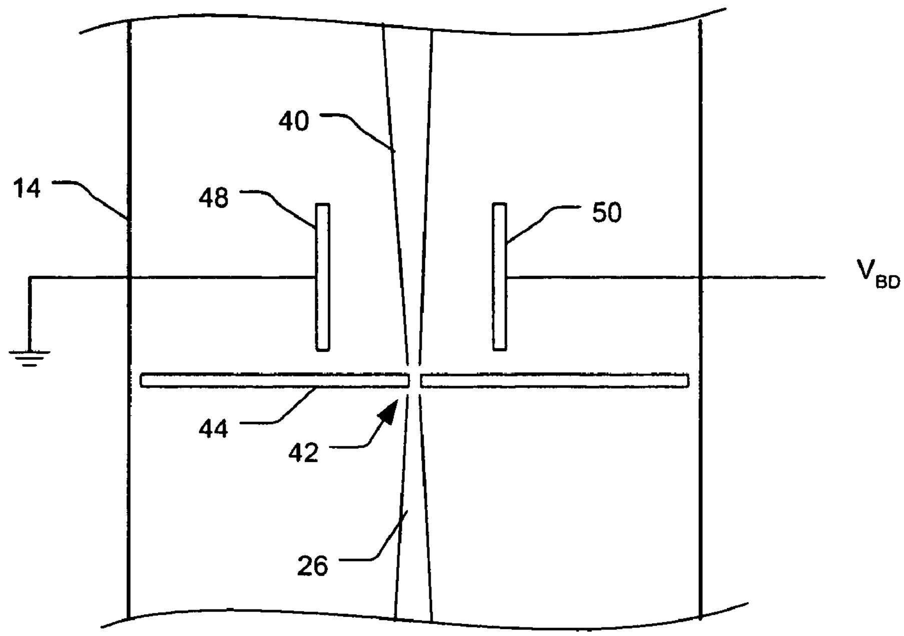
FIG. 5 is a schematic view of beam deflection apparatus in an area adjacent to a resolving opening of an analyzer module of the ion implanter of FIG. 1.

FIG. 5 shows an area of the analyzer module 14 adjacent to the corrector module 16. The above-described source ion beam portion is depicted at 40 by a wide arrow. The source ion beam portion 40 is directed toward a resolving opening 42 that is surrounded by a conductive resolving plate 44. As described above, the ion species to be implanted follows a trajectory through the opening 42 to form the terminal ion beam portion 26 containing almost exclusively such desired ion species. The non-desired ion species generally follow respective trajectories that intersect with the resolving plate 44, such that they are shunted away and thus are not implanted in the wafer 28.

Included immediately upstream of the resolving plate 44 are a pair of beam deflection plates 48, 50 that are used as "fast beam gates" to quickly switch the terminal ion beam portion 26 on and off as part of the glitch detection and recovery processes. In the illustrated embodiment, one plate 48 is connected to ground, and the other plate 50 has a beam deflection voltage $V_{BD}$ coupled thereto. As described below, the beam deflection voltage $V_{BD}$ can be switched between a ground potential and a maximum negative potential supplied by a beam deflection power supply. When the beam deflection voltage $V_{BD}$ is at the ground potential, the source ion beam portion 40 is directed toward the resolving opening 42 as described above, such that the terminal ion beam portion 26 is generated for implantation. When the beam deflection voltage $V_{BD}$ is at the maximum negative potential, the entire source ion beam portion 40 is directed away from the resolving opening 42, such that the terminal ion beam portion 42 is substantially absent, and consequently no implantation is occurring.

Figure 6:
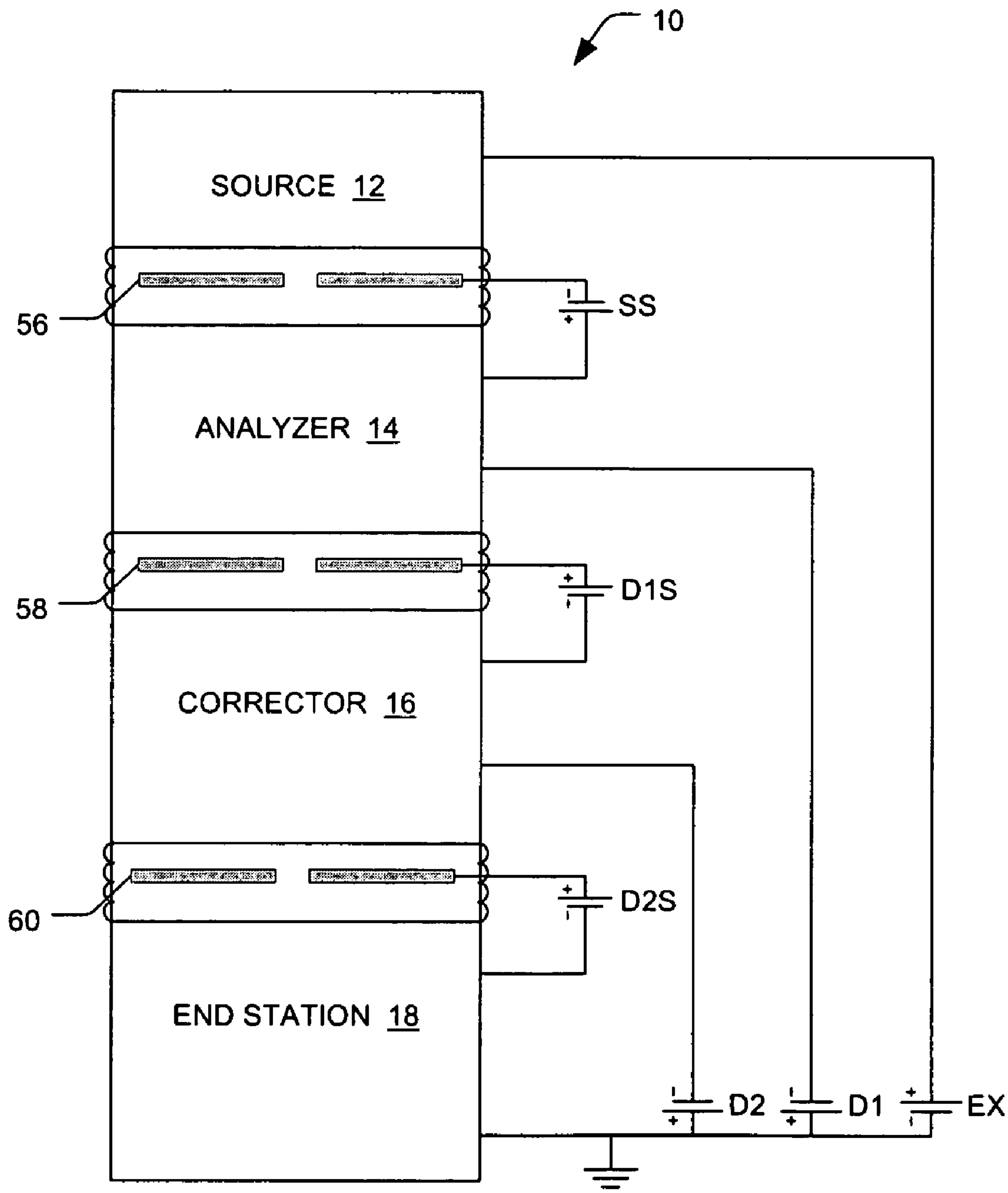
FIG. 6 is a schematic depiction of various power supplies present in the ion implanter of FIG. 1.

FIG. 6 illustrates several power supplies used within the ion implanter 10. The extraction potential is established by an extraction supply EX coupled between the source module 12 and the end station 18, which is connected to ground potential. A first change in beam energy can be effected by a first power supply D1 coupled between the analyzer module 14 and the end station 18. A second change in beam energy can be effected by a second power supply D2 coupled between the corrector module 16 and the end station 18. Respective power supplies SS, D1S and D2S are connected between respective suppression electrodes 56, 58, and 60 and respective modules 14, 16 or 18. Not shown in FIG. 6 are various diodes commonly used for protection purposes at different points within the ion implanter 10. In one embodiment, typical values for the various supplies are as shown in the table below. It will be appreciated that other supply voltages and supplies may be used in alternative embodiments.

| Supply | Value |
|---|---|
| EX | +10 kV |
| D1 | −30 kV |
| D2 | −10 kV |
| SS | −20 kV |
| D1 | −25 kV |
| D2S | −25 kV |

Figure 7:
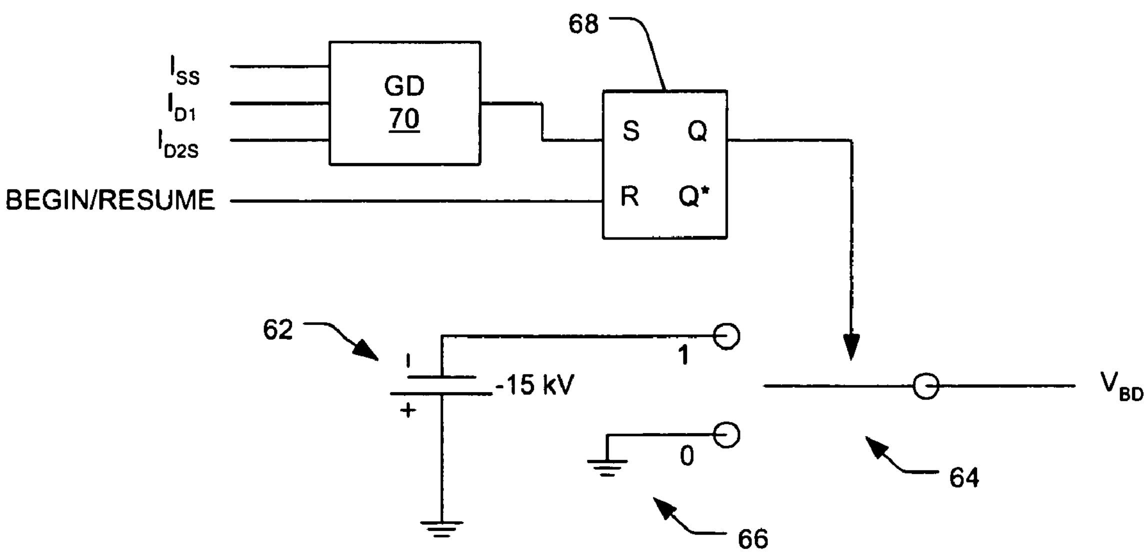
FIG. 7 is a schematic diagram of beam control circuitry for generating a beam deflection voltage provided to the beam deflection apparatus of FIG. 5.

FIG. 7 shows beam control circuitry that generates the beam deflection voltage $V_{BD}$. Included is a beam deflection power supply 62, which in the illustrated embodiment provides an output of −15 kV. A high-voltage switch 64 is set to connect to either the output of the supply 62 or to a ground node 66. The position of the switch 64 is determined by the state of a latch 68. When the output of the latch 68 is a logic "1", then the switch 64 is set to connect to the output of the supply 62, so that the voltage $V_{BD}$ is equal to −15 kV. When the output of the latch 68 is a logic "0", then the switch 64 is set to connect to the ground node 66, so that the voltage $V_{BD}$ is equal to zero volts.

The latch 68 is reset on assertion of a control signal BEGIN/RESUME, which occurs prior to the beginning of an implantation operation and when implantation is to resume as part of recovering from a glitch condition. The normal state of the latch 68 is a reset state, so that the output voltage $V_{BD}$ is normally equal to zero volts, and the terminal ion beam portion 26 (FIG. 5) is present if the source ion beam portion 40 is present.

The latch 64 becomes set on assertion of a GLITCH signal from glitch detection (GD) circuitry 70. When the latch 68 is set, the output voltage $V_{BD}$ is equal to −15 kV, deflecting the ion beam to extinguish the terminal ion beam portion 26 (FIG. 5) even if the source ion beam portion 40 is present. This operation is described in more detail below.

When recovering from a glitch condition, the control circuitry 22 (FIG. 1) synchronizes the BEGIN/RESUME signal with the re-scanning of the wafer 28 that was being scanned when the glitch occurred. In particular, the control circuitry 22 asserts the BEGIN/RESUME signal as the wafer arrives at the point at which implantation was interrupted due to the glitch, as described above with reference to FIG. 3. It is assumed that the plasma within the source module 12 will either have remained established or will have been re-established prior to this time, such that implantation resumes very rapidly as the voltage $V_{BD}$ is set equal to zero volts and the beam-deflecting field between deflection plates 48 and 50 (FIG. 5) collapses. Due to the rapid re-establishment of the terminal ion beam portion 26, the profile of the implanted region 30 remains substantially uniform across the wafer 28.

In the illustrated embodiment, the glitch detection circuitry 70 monitors three operating parameters to detect the occurrence of a glitch that may so affect the quality of the ion beam that implantation should be interrupted. These parameters are source suppression current, D1 current, and D2 suppression current, which are the magnitudes of the respective currents supplied by the power supplies SS, D1 and D2S of FIG. 6. These currents typically have relatively stable values during normal implantation operation. However, when a beam glitch occurs, one or more of these currents will experience a fluctuation. In FIG. 7, current signals $I_{SS}$, $I_{D1}$ and $I_{D2S}$ are generated by current measuring circuitry (not shown) within the respective power supply SS, D1 and D2S. The glitch detection circuitry 70 monitors each of these signals for a fluctuation of a predetermined magnitude. When such a fluctuation in any of these supply currents is detected, the output from the glitch detection circuitry 70 is asserted in order to set the latch 48, causing the beam deflection voltage $V_{BD}$ to become equal to −15 kV. This in turn results in the deflection of the source ion beam portion 40 such that the terminal ion beam portion 26 becomes extinguished, as described in more detail below.

It will be appreciated that the beam deflection voltage $V_{BD}$ can be lower or higher than −15 kV in alternative embodiments, or may be a programmable voltage rather than a fixed voltage. The value of the beam deflection voltage $V_{BD}$ is determined by a number of parameters including ion type, energy, and charge state.

Figure 8:
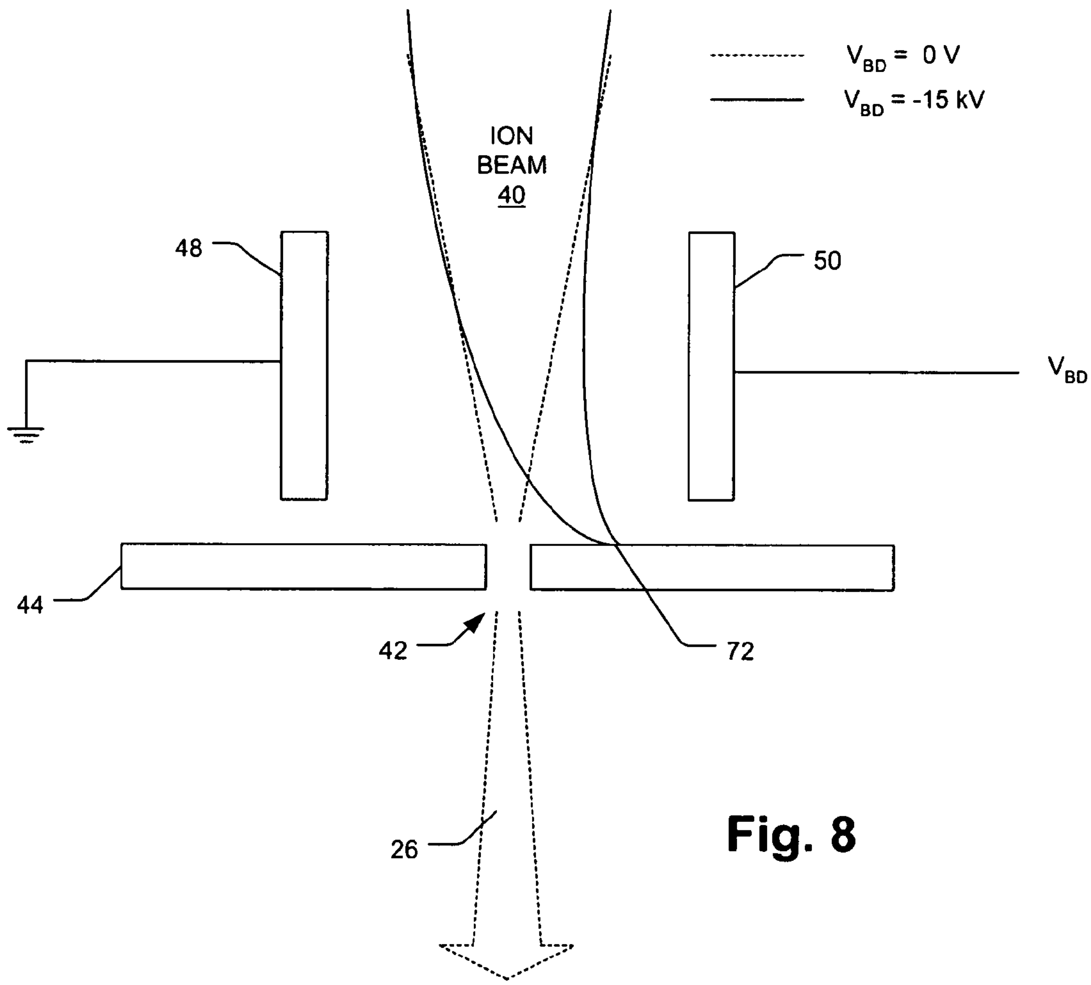
FIG. 8 is a schematic depiction illustrating the deflection of an ion beam by the beam deflection apparatus of FIG. 5.

FIG. 8 illustrates the operation of the beam deflection apparatus within the analyzer module 14. When the beam deflection voltage VBD is equal to 0 V, no electrostatic field exists across the deflection plates 48 and 50, and the source ion beam portion 40 is directed toward the resolving opening 42. The terminal ion beam portion 26, consisting essentially of the desired species, is established and directed toward the end station 18 in which implantation is occurring. When the beam deflection voltage VBD is equal to −15 kV, an electrostatic field exists across the deflection plates 48 and 50. The source ion beam portion 40, which contains positive ions almost exclusively, is narrowed and bent toward the plate 50. As a result, the source ion beam portion 40 strikes the resolving plate 44 at a location 72 away from the resolving opening 42. The terminal ion beam portion 26 is extinguished, and implantation is ceased.

Figure 9:
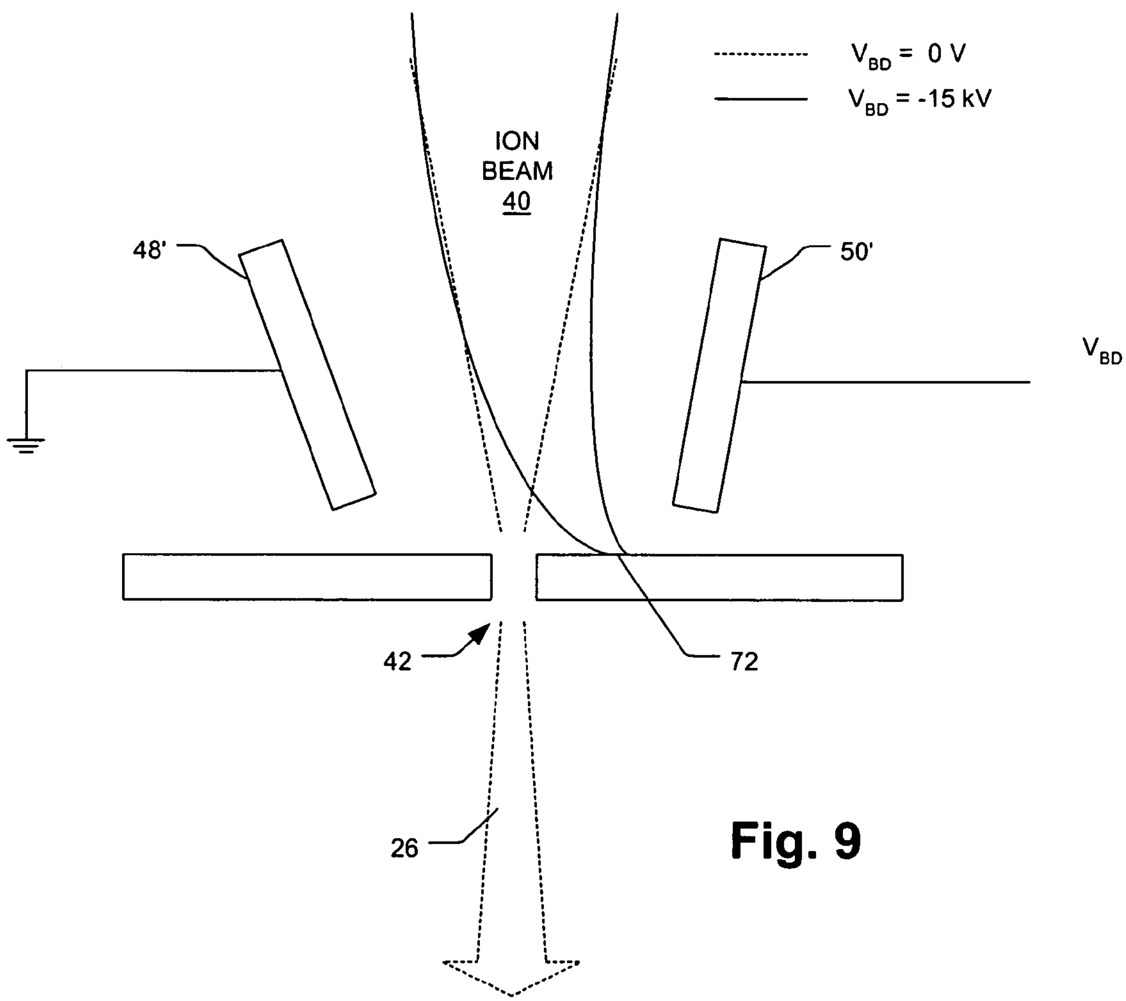
FIG. 9 is a schematic depiction illustrating the deflection of an ion beam by an alternative beam deflection apparatus in located in the same area as the beam deflection apparatus of FIG. 5.

FIG. 9 shows an alternative configuration of the beam deflection apparatus within the analyzer module 14. In this configuration, the deflection plates 48' and 50' are angled slightly, for example at about 10 degrees. This configuration may provide for more efficient deflection of the source ion beam portion 40 for a given plate spacing and deflection voltage.

Figure 10:
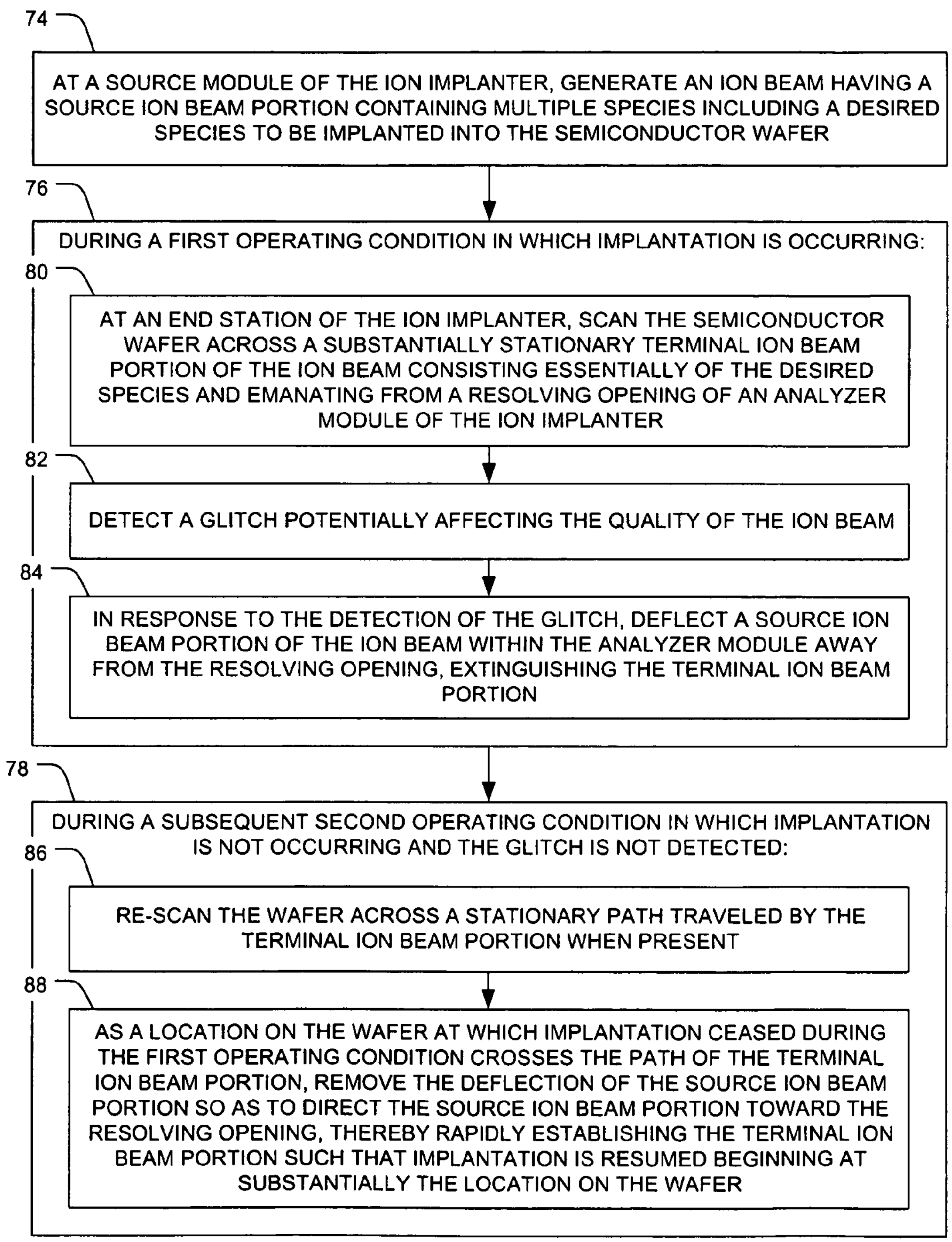
FIG. 10 is a flow diagram depicting one aspect of the operation of the beam deflection apparatus of FIG. 5.

FIG. 10 illustrates a method of operating the ion implanter 10 that utilizes its structural and functional features described above. At step 74, an ion beam is generated at the source module 12. The ion beam has a source ion beam portion (e.g., portion 40 within the analyzer 14 as shown in FIG. 5) that contains multiple species including the desired species to be implanted. Step 76 is a collection of steps carried out during a first operating condition in which implantation is occurring, and step 78 is a collection of steps carried out during a subsequent second operating condition in which implantation is occurring.

In step 80 of step 76, at an end station (e.g. 18) of the ion implanter the semiconductor wafer is scanned across a substantially stationary terminal ion beam portion (e.g. portion 26) of the ion beam. The terminal ion beam portion consists essentially of the desired species and emanates from the resolving opening 42 of the analyzer module 14. In step 82, a glitch is detected that potentially affects the quality of the ion beam, such as a spike in one of the supply currents as described above. In step 84, in response to the detection of the glitch, the source ion beam portion 40 is deflected away from the resolving opening 42, thereby substantially extinguishing the terminal ion beam portion 26.

In step 86 of step 78, the wafer 28 is re-scanned across the path traveled by the terminal ion beam portion 26 when present. In step 88, as a location on the wafer at which implantation ceased during the first operating condition (e.g., the location shown in FIG. 3) crosses the path of the terminal ion beam portion 26, the deflection of the source ion beam portion 40 is removed so as to direct the source ion beam portion 40 toward the resolving opening 42, thereby rapidly establishing the terminal ion beam portion 26 such that implantation is resumed beginning at substantially the location on the wafer.

Two initial tests may be used to ensure correct operation of the beam deflection apparatus to quickly turn the beam on. These tests can be performed during beam tuning prior to the beginning of wafer processing. The tests involve measuring beam current in a "setup cup", which is a Faraday cup located on the opposite side of the mass resolving slit from the beam deflection apparatus (not shown in the Figures). In a first test, the beam is swept from the deflected position (i.e., $V_{BD}$=−15 kV) to the normal position (i.e., $V_{BD}$=0 V) while the beam current in the setup cup is monitored. The beam current in the setup cup should be zero except when $V_{BD}$ is equal to zero. This test ensures that while the beam is being swept back onto the wafer, the wafer is not exposed to undesired beamlets or incorrect ion species (as might be dispersed by the analyzer magnet and inadvertently swept onto the wafer by injudicious use of the beam deflection apparatus). The second test (which can be a component of the first test) is to verify that the beam current in the setup cup is zero or very nearly zero when the beam deflection apparatus is energized (i.e., $V_{BD}$=−15 kV). This test ensures that the beam is completely off the wafer when the beam is being blanked.

Although in the foregoing description the beam deflection apparatus is located immediately behind the mass resolving slit at the exit from the analyzer module 14, in alternative embodiments it may be advantageous to locate the beam deflection apparatus at other locations in a stationary-beam ion implanter. For example, the beam deflection apparatus may be located at the input to the corrector module 16 or even further up the beam line. Additionally, although prior beam-scanning implanters have included beam-scanning units supplemented with circuitry for deflecting the beam entirely away from the wafer, it may be advantageous to use separate deflection apparatuses for normal beam scanning and for glitch-related deflection. In such implanters, it may be especially advantageous to place the deflection apparatus for glitch recovery behind the mass resolving slit, as described above, while the normal beam scanning apparatus is placed elsewhere along the beam path.

In the illustrated embodiment, a single negative supply voltage is used to generate the beam deflection voltage applied across the deflection plates 48 and 50. It will be appreciated that this configuration operates to "pull" the beam toward the negatively charged plate. In alternative embodiments, it may be desirable to use a single positive supply instead, which would result in a "pushing" action on the beam to one side of the mass resolving slit. As a further alternative, it is possible to use two supplies of opposite polarity, such that the overall beam deflection voltage is equal to the sum of the magnitudes of the supply voltages. The single-supply configurations have the advantage of lower cost due to the use of only one power supply.

Also in the illustrated embodiment, beam glitch detection is achieved somewhat indirectly by monitoring various power supply currents as described above. As an alternative, it is possible to directly monitor beam current, for example by use of a Faraday cup in the end station 18.

Those skilled in the art will appreciate that embodiments and variations of the present invention other than those explicitly disclosed herein are possible. It is to be understood that modifications to the methods and apparatus disclosed herein are possible while still achieving the objectives of the invention, and such modifications and variations are within the scope of this invention. Accordingly, the scope of the present invention is not to be limited by the foregoing description of embodiments of the invention, but rather only by the claims appearing below.

What is claimed is:

1. An ion implanter, comprising:

a source of an ion beam having a terminal ion beam portion traveling along a beam path and being stationary during an implantation operation;

an end station operative to scan a semiconductor wafer across the stationary terminal ion beam portion of the ion beam during the implantation operation;

beam deflection apparatus being operative (1) in response to a first beam deflection voltage in a first operating condition, to direct the ion beam onto the beam path such that the terminal ion beam portion strikes the semiconductor wafer, and (2) in response to a second beam deflection voltage in a second operating condition, to direct the ion beam away from the beam path such that the terminal ion beam portion does not strike the semiconductor wafer; and beam control circuitry operative during the second operating condition to transition the ion implanter to the first operating condition by rapidly switching from the second beam deflection voltage to the first beam deflection voltage.

2. An ion implanter according to claim 1, further comprising an analyzer operative to spatially separate species in a source ion beam portion of the ion beam to generate the terminal ion beam portion of the ion beam, the analyzer including a resolving opening from which the terminal ion beam portion emanates in the first operating condition, and wherein the beam deflection apparatus is adjacent to the resolving opening of the analyzer and is operative (1) in response to the first beam deflection voltage, to direct the separated species of the source ion beam portion toward the resolving opening such that the terminal ion beam portion is present and consists essentially of the desired species, and (2) in response to the second beam deflection voltage, to direct the separated species of the source ion beam portion away from the resolving opening such that the terminal ion beam portion is substantially extinguished.

3. An ion implanter according to claim 1, wherein the beam control circuitry is operative during the first operating condition to transition the ion implanter to the second operating condition by rapidly switching the beam deflection voltage from the first value to the second value.

4. An ion implanter according to claim 3, wherein the beam control circuitry includes glitch detection circuitry operative to detect the a glitch potentially affecting the quality of the ion beam, and wherein the switching of the beam deflection voltage from the first value to the second value occurs in response to the detection of the glitch.

5. An ion implanter according to claim 4, wherein the glitch detection circuitry includes power supply monitoring circuitry that detects the glitch as an abrupt change in an operating parameter of one or more power supplies within the ion implanter.

6. An ion implanter according to claim 5, wherein the power supplies include a source suppression supply and a deceleration supply.

7. An ion implanter according to claim 4, wherein the glitch detection circuitry includes a Faraday cup in the end station operative to receive a portion of the beam.

8. An ion implanter according to claim 1, wherein the beam deflection apparatus comprises a pair of spaced conductive plates.

9. An ion implanter according to claim 8, wherein a first one of the plates is connected to a fixed potential and a second one of the plates is coupled to a switch operative to supply the first and second values of the beam deflection voltage with respect to the fixed potential.

10. An ion implanter according to claim 8, wherein the first value of the beam deflection voltage is equal to the fixed potential and the second value of the beam deflection voltage is a negative potential relative to the fixed potential.

11. An ion implanter according to claim 8 wherein each of the spaced conductive plates is coupled through a respective switch to a respective one of two power supplies, the power supplies being of opposite polarity such that the beam deflection voltage is the sum of the magnitudes of the power supplies.

12. An ion implanter according to claim 8 wherein the spaced conductive plates are planar and substantially parallel to each other.

13. An ion implanter according to claim 8 wherein the spaced conductive plates are planar and slightly tilted from parallel so as to be more closely spaced at an end adjacent to the resolving opening.

14. An ion implanter according to claim 1, wherein the terminal ion beam portion has a flattened cross section extending substantially across the semiconductor wafer at the location of the semiconductor wafer in the end station, and wherein the end station is operative to scan the wafer only along a first axis perpendicular to the flattened cross section of the ion beam.

15. An ion implanter according to claim 1, wherein the terminal ion beam portion has a substantially circular cross section at the location of the semiconductor wafer in the end station, and wherein the end station is operative to scan the wafer along first and second axes perpendicular to each other and to the axis of the terminal ion beam portion.

16. An ion implanter according to claim 1, where the value of the first beam deflection voltage is programmable.

17. An ion implanter, comprising:

a source of an ion beam having a source ion beam portion;

an analyzer operative to spatially separate species in the source ion beam portion of the ion beam to generate a terminal ion beam portion of the ion beam, the analyzer including a resolving opening from which the terminal ion beam portion emanates in a first operating condition;

an end station operative to scan a semiconductor wafer across the terminal ion beam portion of the ion beam during an implantation operation;

beam deflection apparatus adjacent to the resolving opening of the analyzer, the beam deflection apparatus being operative (1) in response to a first beam deflection voltage in the first operating condition, to direct the separated species of the source ion beam portion toward the resolving opening such that the terminal ion beam portion is present and consists essentially of the desired species, and (2) in response to a second beam deflection voltage in a second operating condition, to direct the separated species of the source ion beam portion away from the resolving opening such that the terminal ion beam portion is substantially extinguished; and beam control circuitry operative during the second operating condition to transition the ion implanter to the first operating condition by rapidly switching from the second beam deflection voltage to the first beam deflection voltage.

18. A method of operating an ion implanter, comprising:

(A) at a source module of the ion implanter, generating an ion beam having a terminal ion beam portion traveling along a beam path and being stationary during an implantation operation;

(B) in a first operating condition in which implantation is occurring during the implantation operation:

(i) at an end station of the ion implanter, scanning a semiconductor wafer across the beam path such that the stationary terminal ion beam portion of the ion beam strikes the semiconductor wafer to effect the implantation;

(ii) detecting a glitch potentially affecting the quality of the ion beam; and (iii) in response to detecting the glitch, directing the ion beam away from the beam path in a manner that rapidly extinguishes the terminal ion beam portion such that implantation is ceased at an ending location on the semiconductor wafer; and (C) in a subsequent second operating condition in which implantation is not occurring and the glitch is not detected:

(i) re-scanning the wafer across the beam path; and (ii) as the ending location on the wafer crosses the beam path, directing the ion beam onto the beam path in a manner that rapidly establishes the terminal ion beam portion such that implantation is resumed beginning at substantially the ending location on the semiconductor wafer.

19. A method according to claim 18, wherein the ion implanter includes an analyzer operative to spatially separate species in a source ion beam portion of the ion beam to generate the terminal ion beam portion of the ion beam, the analyzer including a resolving opening from which the terminal ion beam portion emanates in the first operating condition, and wherein the directing of the ion beam is effected by beam deflection apparatus adjacent to the resolving opening of the analyzer by (1) in response to a first beam deflection voltage, directing the separated species of the source ion beam portion toward the resolving opening such that the terminal ion beam portion is present and consists essentially of the desired species, and (2) in response to a second beam deflection voltage, directing the separated species of the source ion beam portion away from the resolving opening such that the terminal ion beam portion is substantially extinguished.

20. A method according to claim 19, wherein the beam deflection apparatus comprises a pair of spaced conductive plates to which the first and second beam deflection voltages are applied.

21. A method according to claim 18, wherein detecting the glitch comprises monitoring a power supply within the ion implanter for an abrupt change in an operating parameter indicative of the glitch.

* * * * *